June 30, 1970 D. H. CHUNG 3,518,449

INTEGRATED LOGIC NETWORK

Filed Feb. 1, 1966 6 Sheets-Sheet 1

INVENTOR:
DAVID H. CHUNG

BY John G. Graham

ATTORNEY

June 30, 1970 D. H. CHUNG 3,518,449

INTEGRATED LOGIC NETWORK

Filed Feb. 1, 1966 6 Sheets-Sheet 2

$T_{X\,off}$, $I = I_R$ $T_{X\,on}$, $I = I_R - I_S$ $T_{X\,off}$, $I = I_{T_2}$ $T_{X\,on}$, $I = -I_{T_1}$

INTEGRATED LOGIC NETWORK

Filed Feb. 1, 1966

United States Patent Office 3,518,449
Patented June 30, 1970

3,518,449
INTEGRATED LOGIC NETWORK

David H. Chung, Dallas, Tex., assignor to Texas Instruments Incorporated, Dallas, Tex., a corporation of Delaware Filed Feb. 1, 1966, Ser. No. 524,173
Int. Cl. H03k *19/34*
U.S. Cl. 307—215 3 Claims

ABSTRACT OF THE DISCLOSURE

Disclosed are integrated logic networks including a plurality of cascaded logic stages formed within a semiconductor substrate; each of the logic stages have several classes of circuit components with one class formed within respective electrically isolated semiconductor pockets in the semiconductor substrate, and with the other class formed in spaced relationship within the remaining portion of the substrate.

The present invention relates generally to logic circuits, and more particularly to an improved NOR gate circuit.

It is desirable to manufacture a logically complete digital network (one capable of performing all logic functions) simply and as inexpensively as possible. One method for accomplishing this objective is to have the digital network be comprised almost exclusively of identical circuit stages, the stages cascaded in a manner whereby the output of one stage feeds directly into an input of the next stage without the requirement of an intermediate stage of a different circuit type. To accomplish this objective requires that the output voltage and/or current of each stage vary between precise levels of substantially identical value to generate the desired voltage and/or current at the input of the succeeding stage. This condition insures reliable switching of each stage from one logic state to another without the use of intermediate amplifier stages. At the same time, when transistors are incorporated in these stages, it is desirable, in order to accomplish fast switching speeds, that these same voltage and current levels be of values that will prevent the transistors from operating in saturation.

It is therefore an object of the invention to devise a logically complete digital network from a plurality of identical circuit stages. It is an additional object of the invention to devise a logically complete digital network where the various logic states represented by the voltage and/or current levels of each circuit stage vary between precise levels of substantially identical value. It is another object of the invention to device a NOR logic circuit which is non-saturated. It is a further object of the present invention to provide a logic circuit of the type which is particularly suited for fabrication in an integrated circuit form.

In accordance with these and other objects, features, and advantages, the present invention is concerned with providing a logically complete digital network utilizing a plurality or series of cascaded logic circuit stages. Each of these stages is identical in that each stage comprises distinct classes of active and/or passive circuit components, the components of the corresponding class of the different stages having identical operating characteristics. The word "identical" is used throughout this application to mean exactly the same or having negligible variations.

In the particular embodiment described subsequently, a digital network comprises a plurality of NOR logic circuits, each circuit comprising three classes of transistors and a load resistor. The network is fabricated as an integrated network in a single slice of semiconductor material, thus enabling components of each stage belonging to the same class to have identical operating characteristics, i.e. "track" each other. The difference in operating characteristics of each of the three classes of transistors is determined by assigning the proper emitter lengths to each class. This component tracking enables all the circuit stages to operate identically, thus enabling the input and output logic levels of each stage to be identical.

Many additional objects and advantages will be evident to those skilled in the art from the following detailed description taken in conjunction with the drawings, wherein.

Figure 1:
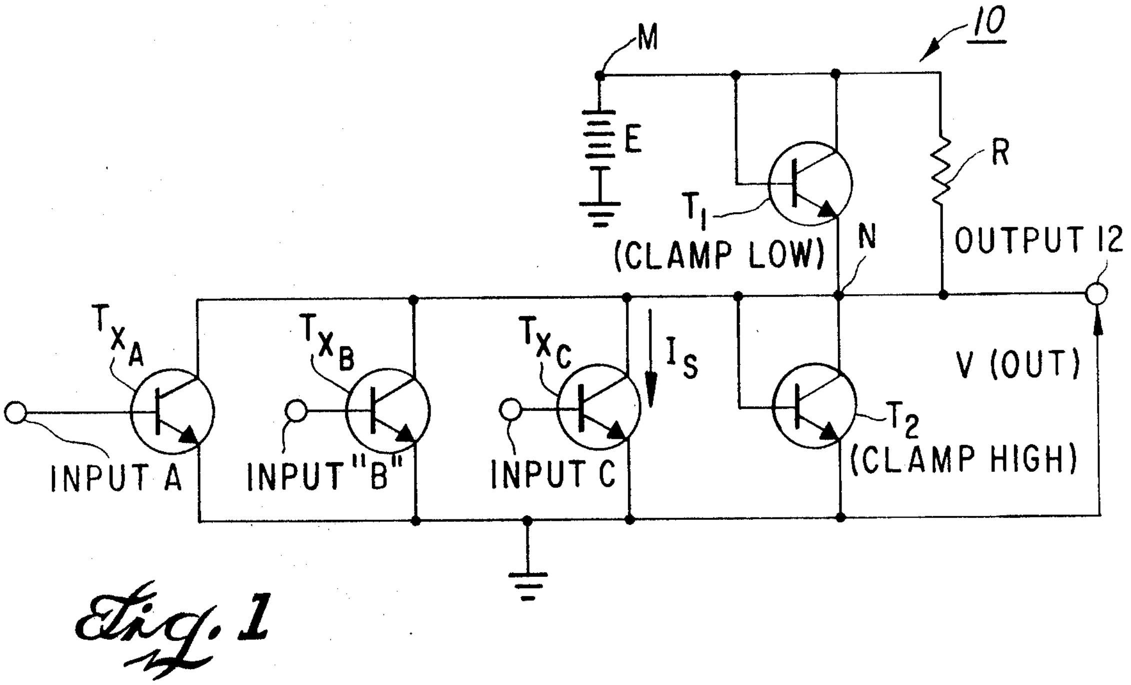
FIG. 1 is a schematic diagram of one NOR circuit stage of a digital network.
Figure 2:
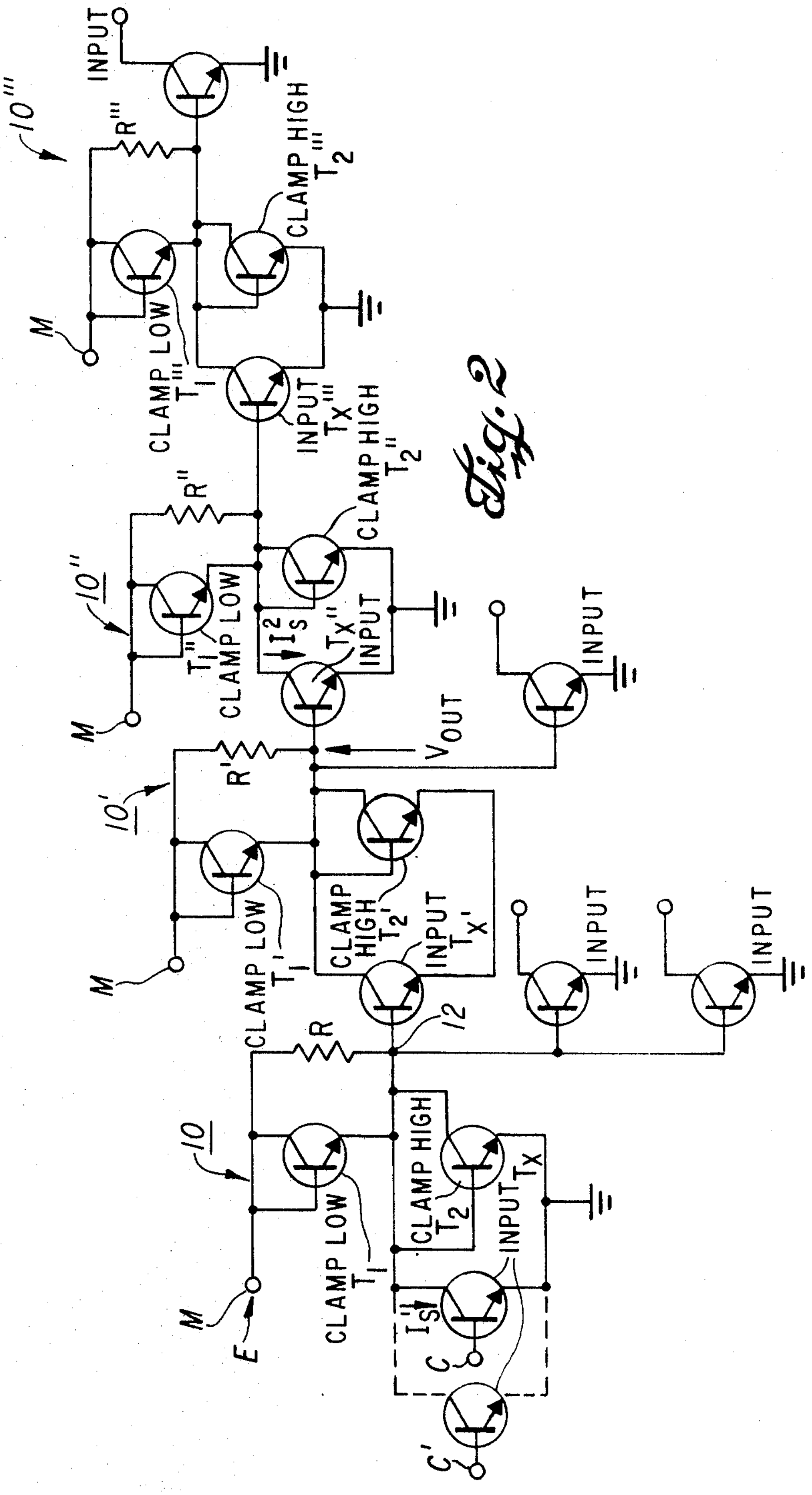
FIG. 2 is a schematic diagram illustrating the cascading of several circuit stages as the one shown in FIG. 1.
Figure 3:
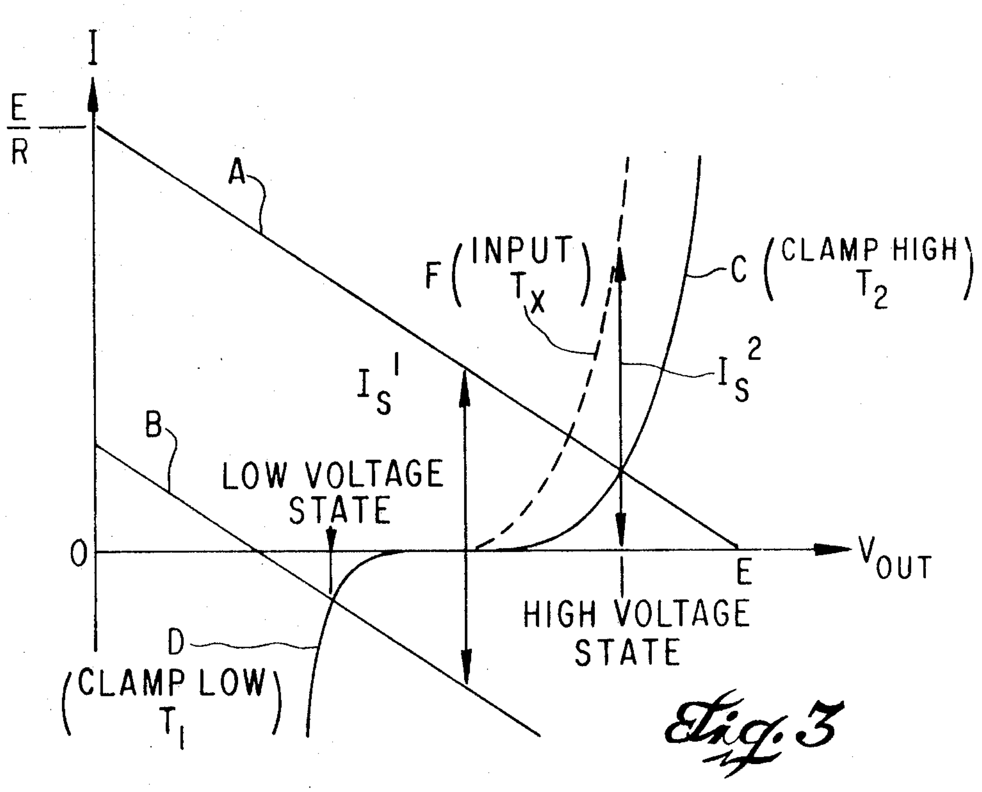
Figure 3A:
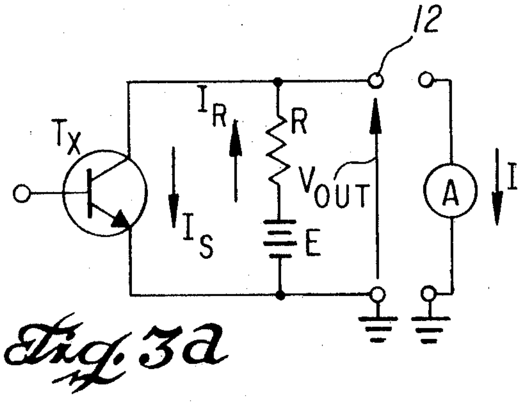
Figure 3B:
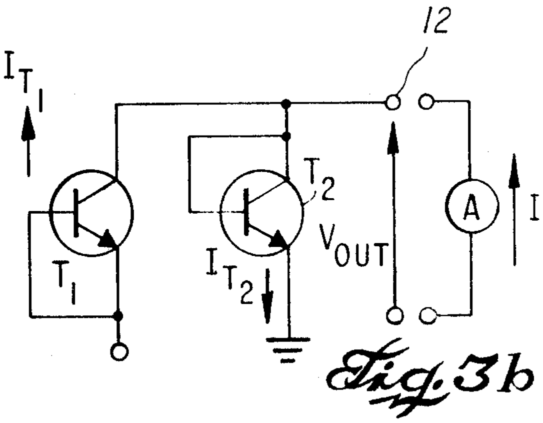
Figure 4:
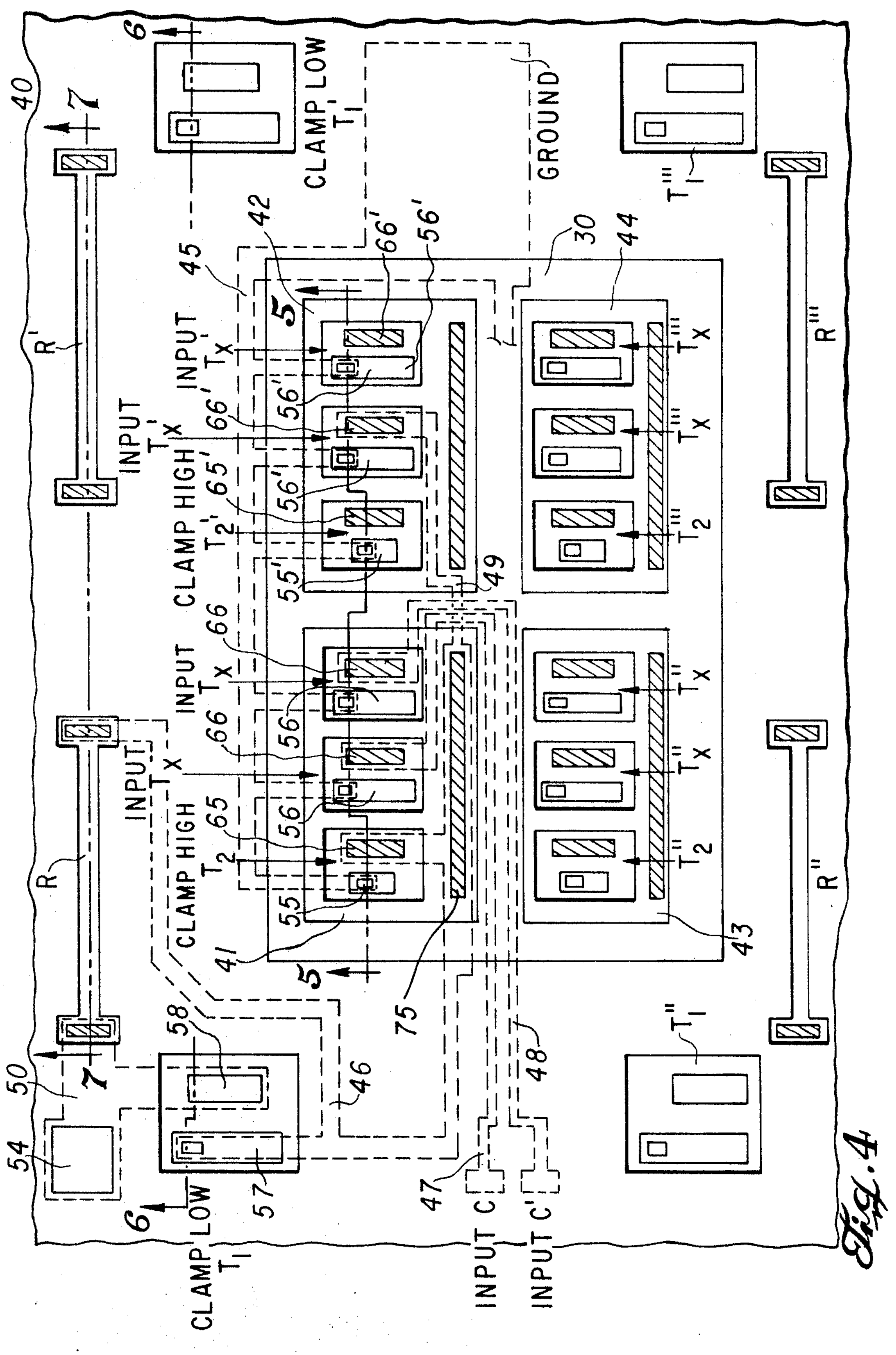
Figures 5, 6, 7:
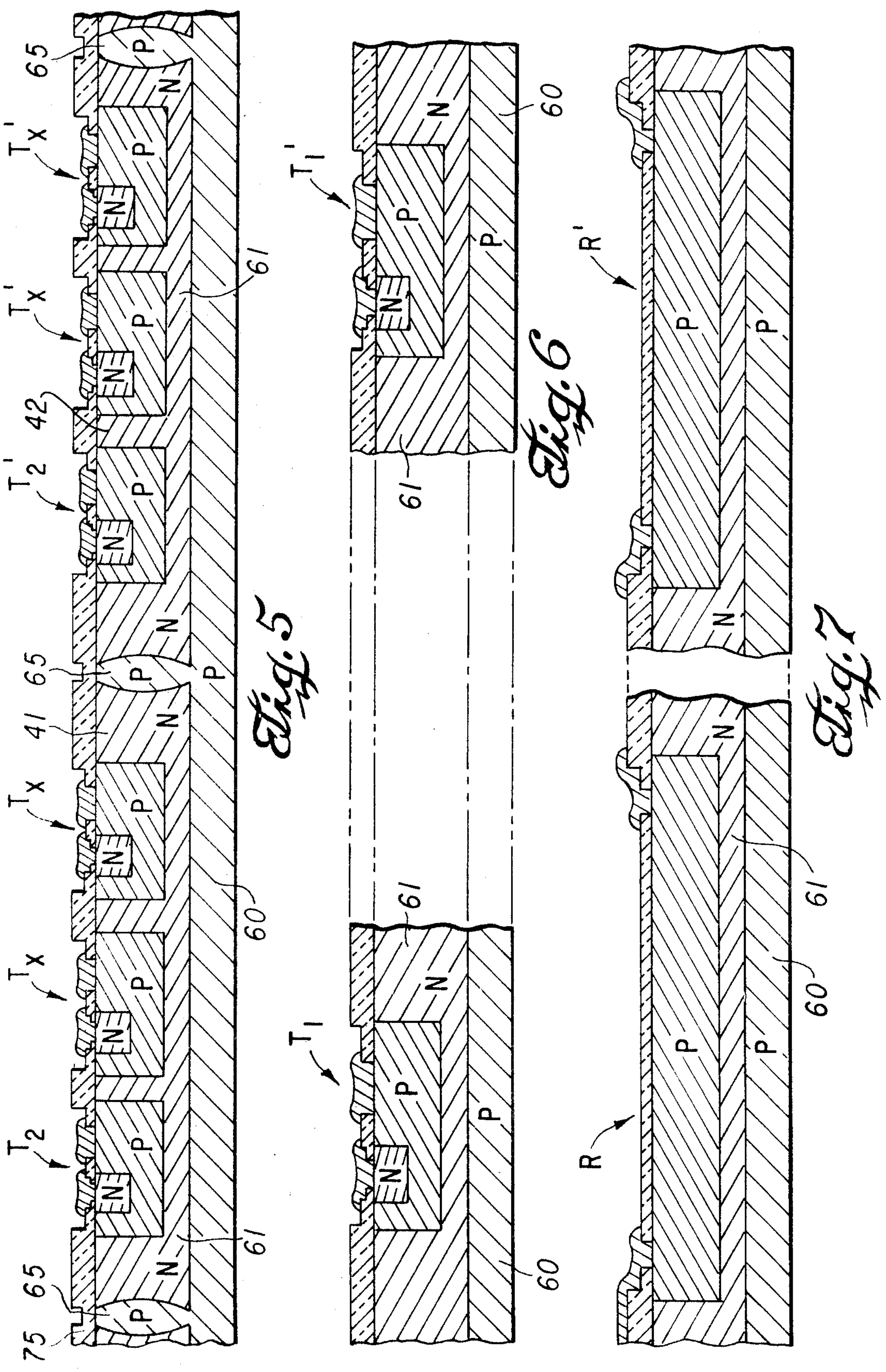
Figure 8:
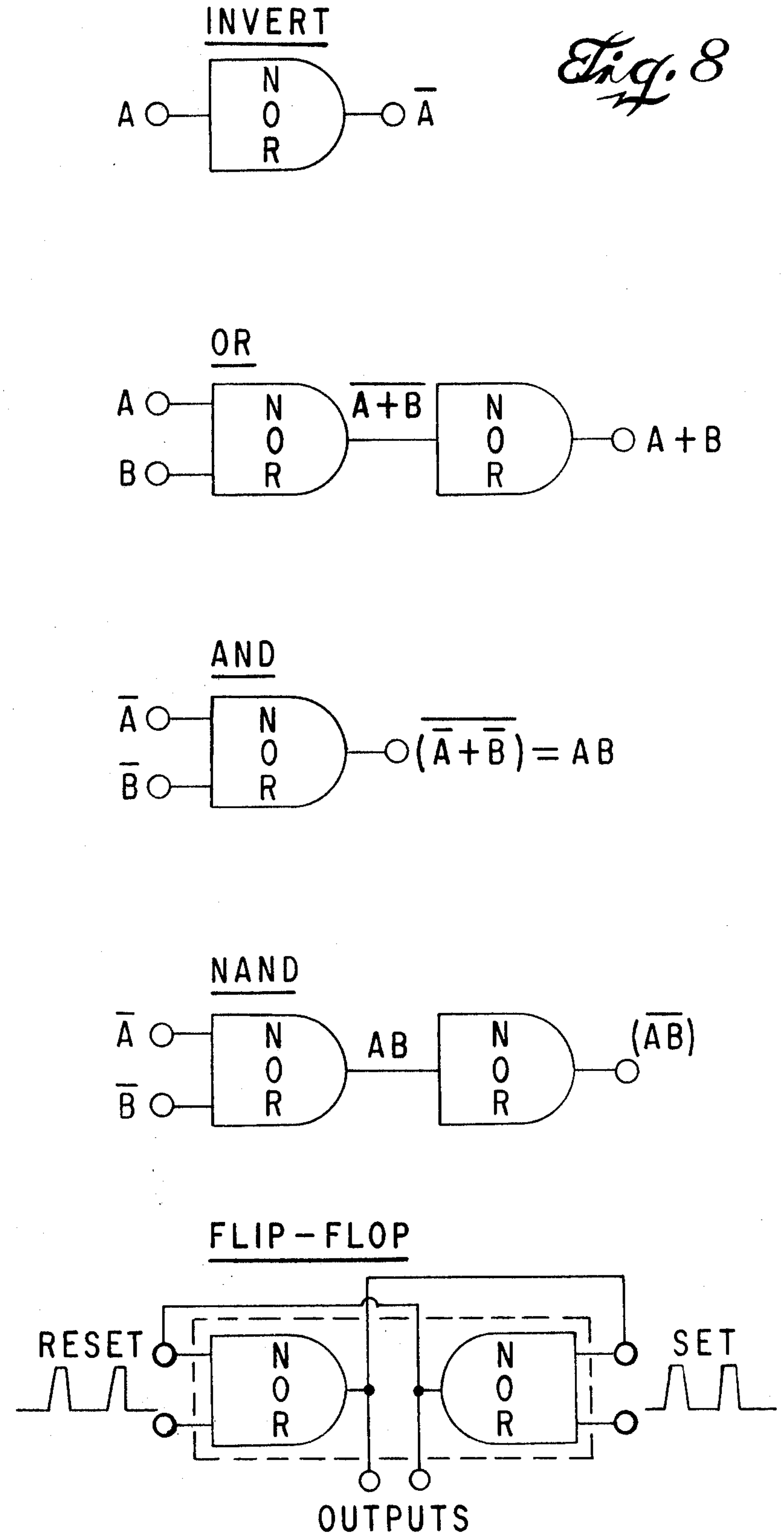

FIGS. 3, 3*a*, and 3*b* depict the operating characteristics of the circuit stage of FIG. 1;

FIG. 4 is a plan view of a portion of a semiconductor slice, showing the circuit components of the digital network of FIG. 2 formed therein;

FIGS. 5, 6, and 7 are cross-sectional views of the semiconductor slice of FIG. 4, taken along the section lines 5—5, 6—6, and 7—7, respectively; and FIG. 8 is a series of diagrams showing schematically the connection of NOR circuit stages to perform various logic functions.

Referring now to the drawings, and in particular to FIG. 1, a NOR logic circuit stage constructed in accordance with the principles of the present invention is indicated generally by the reference numeral 10. The circuit is comprised of three distinct classes of transistors; namely, NPN input transistors as $T_{X_A}$, $T_{X_B}$, and $T_{X_C}$; NPN clamp-high transistors $T_2$ and NPN clamp-low transistors $T_1$. The circuit 10 has a plurality of input terminals as A, B, and C, and a single output terminal 12. The input transistors $T_{X_A}$, $T_{X_B}$, and $T_{X_C}$ are connected in parallel with the clamp-high transistor $T_2$ as shown, the emitters of all these transistors being connected to ground. The collectors of the input transistors $T_{X_A}$, $T_{X_B}$, and $T_{X_C}$, as well as the collector of the transistor $T_2$ are connected to the emitter of the clamp-low transistor $T_1$. A resistor R shunts the transistor $T_1$. Both transistors $T_1$ and $T_2$ have their respective bases and collectors tied together; hence, these two transistors function as diodes. A source E of positive potential biases the terminal M.

The operation of the NOR logic circuit of FIG. 1 is presently described with reference to two-level logic. By two level logic is meant a voltage oriented binary logic in which 0 and 1 correspond to low and high voltages, respectively. When the voltage at the input terminals A, B and C is at the low level, i.e. logical 0, the input transistors are turned off and conduct little or no current. During this time, the transistor (diode) $T_1$ conducts little or no current, the current flow being primarily through the resistor R and the clamp-high transistor (diode) $T_2$, the voltage drop across transistor $T_2$ providing the output voltage. In other words, when the input voltages are at their minimum (logical 0), the voltage $V_{out}$ at the output terminal 12 is clamped to the high voltage state by the base-emitter diode of transistor $T_2$.

When the voltage at any of the input terminals, for example terminal C, is at the high level, i.e. logical 1, the input transistor $T_{X_C}$ begins to conduct. This increase in current $I_S$ causes the voltage at node N to drop until the transistor (diode) $T_2$ turns off and the clamp-low transistor (diode) $T_1$ turns on or conducts. Thus the low voltage state of $V_{out}$ is determined by the difference between the voltage of the power supply E and the drop across the base-emitter diode of the clamp-low transistor $T_1$, $T_1$ serving to "clamp" the output at the low volage state.

We will now describe the operation of the logic circuit shown in FIG. 1 when forming part of an entire digital network shown in FIG. 2. Accordingly, a plurality of "identical" circuit stages 10, 10′, 10″ and 10‴ for example, are cascaded so that the output of one stage is directly coupled to the input of the following stage. When a high voltage corresponding to logic level 1 appears at the input terminal C of circuit stage 10, a current $I_S^1$ flows through the input transistor $T_X$ lowering the output voltage at the terminal 12 to the low voltage stage (logic level 0). This low voltage, appearing at the input terminal of the input transistor $T_X'$ of second stage 10′, produces little or no current through this transistor, thereby setting the output voltage $V_{out}$ of the second stage at the high voltage state. This high voltage at the output of the second stage is then directly coupled to the input of the third stage 10″ causing a current $I_S^2$ to flow in the input transistor $T_X'$, this current thereby lowering the output voltage of the third stage 10″ to the low voltage point, and so on.

The clamp-low and clamp-high transistors not only establish the low and high voltage states, respectively, but also insure that the input transistors operate in their nonsaturated condition. For example, the clamp low transistor (diode) $T_1$ clamps the low voltage level at a point sufficiently high to limit the extent that the collector-base junctions of the input transistors $T_X$ are forward biased, no matter how many input transistors are conducting at the time. The clamp high transistor (diode) $T_2$, on the other hand, clamps the high voltage state at a value that will not "overdrive" the succeeding input transistor $T_{X'}$ into saturation.

The operating characterisics of each of the components for the above-described operation are illustrated in FIGS. 3, 3*a*, and 3*b*. The composite logic circuit of stage 10, for example, is resolved in two parts, the first part shown in FIG. 3*a*, representing the equivalent circuit when only the battery E, the resistor R, and the input transistor $T_X$ are considered, and the second part, shown in FIG. 3*b*, representing the equivalent circuit when only the clamp-high tarnsistor $T_2$ and the clamp-low transistor $T_1$ are considered.

Referring initially to the equivalent circuit of stage 10, shown in FIG. 3*a*, a load current I through the ammeter A is plotted in FIG. 3 for output voltage $V_{out}$ varying from zero to E. Curve A in FIG. 3 represents this plot when the input transistor $T_X$ is turned off, the load current then being equal to $I_R$, the current through the resistor R. Curve B represents this plot when the input transistor $T_X$ is turned on, the load current then being equal to $I_R$ minus $I_S^1$. Hence the curbe B is at the same slope as curve A, but at a lower value of $I_S^1$.

Referring to the equivalent circuit in FIG. 3*b*, the load current I versus output voltage $V_{out}$ is plotted in FIG. 3 the curve C representing the plot when the input transistor $T_X$ is off (i.e., the V–I characteristics of the clamp-high transistor $T_2$). Curve D represents the plot when the input transistor $T_X$ is on (i.e. the V–I characteristics of the clamp-low transistor $T_1$).

As illustarted in FIG. 3, the clamp-high transistor (diode) $T_2$ is designed so that its curve C intersects the curve A where the high voltage state is to be. Similarly, the clamp-low transistor (diode) $T_1$ is designed so that its curve D intersects the curve B where the low voltage state is to be.

To insure reliable switching of each succeeding circuit stage 10, 10′, 10″, 10‴, etc. two fundamental requirements must be met. First, the input and output voltages of each stage must vary precisely between the points of the low and high voltage states or within a very small range around these points. This necessitates that the operating characteristics of components of like class in each stage exhibit the same operating characteristics, i.e. exhibit component tracking. For example, the voltage and current characteristics of the clamp low transistor $T_1$ should be identical to the voltage and current characteristics of clamp-low transistor $T_1'$, $T_1''$, etc.; the voltage and current characteristics of the clamp-high transistor $T_2$ should be identiacl to the voltage and current characteristics of the clamp-high transistor $T_2'$, $T_2''$, etc., and similarly for the resistor R and the input transistors $T_X$, $T_X'$, $T_X''$, etc.

Second, the input transistors $T_X$, etc. when turned on, must generate sufficient current to lower the output voltage of that particular stage of the low voltage state. This precipitates the need for the input transistor $T_{X''}$, for example, to conduct more current than clamp-high transistor $T_2$ of the preceeding stage for the identical high voltage. In addition, the current $I_S^2$ should be equal to $I_S^1$. These latter two criterion are utilized in designing the input transistors $T_X$ to have the V–I characteristics designated by the curve F in FIG. 3 where a voltage $V_{out}$ at the high voltage state results in the current $I_S^2=I_S^1$ in the input transistor $T_X$.

The requirement for component tracking, highly impractical in discrete component logic networks due to the difficulty, if not impossibility, of obtaining thousands of components exhibiting substantially identical operating characteristics, is achieved by utilizing integrated circuit techniques for fabricating the entire digital network within a single slice of semiconductor material. As to the realization of three distinct classes of transistors (input transistors, clamp-high transistors, and clamp-low resistors) having the different V–I operating characteristics shown in FIG. 3, one needs only to vary the emitter-base periphery by assigning the proper emitter length, for example, to each class of transistors.

In accordance with this approach, FIG. 4 illustrates one example of an integrated circuit layout for the circuit stages 10, 10′, 10″, and 10‴ shown in FIG. 2. All of the active and circuit components are formed within a single semiconductor wafer, for example, silicon, the numeral 40 representing just one area of the entire slice. The input and clamp-high transistors of each stage share respective isolation pockets 41, 42, 43, and 44 as shown, the clamp-low transistors and the resistors of all the stages sharing the remainder of the material of the slice.

An interconnection scheme connecting the active and passive components of only the circuit stages 10 and 10′ is shown, but this is representative of a typical interconnection scheme for the remaining stages. Accordingly, a conductor 45 interconnects the emitters 56 and 56′ of the input transistors $T_X$ and $T_{X'}$ and the emitters 55 and 55′ of the clamp-high transistors $T_2$ and $T_{2'}$ to the ground terminal. A conductor 46 connects the base region 65 and the common collector region 75 of the clamp-high transistor $T_2$ to the emitter 57 of the clamp-low transistor $T_1$ and also to one end of the load resistor R. Conductors 47 and 48 connect the base regions 66 of the input transistors $T_X$ to the input terminals C and C′ respectively. The conductor 49 connects the common collector 75 of the input transistors $T_X$ and the clamp-high transistor $T_2$ to the base input 66′ of the input transistor $T_{X'}$. Conductor 50 interconnects the base 58 of the clamp-low transistor $T_1$ to the common collector terminal 54 and the other end of the resistor R. The terminal 54 also serves as the bias point of the voltage E.

As discussed previously, the emitter stripe 56 of the input transistor $T_X$ is longer than the emitter stripe 55 of the clamp-high transistor $T_2$ thus increasing the emitter-base periphery of the input transistor $T_X$ to provide the V–I characteristics illustrated in FIG. 3. The relative emitter length of the clamp-low transistor $T_1$ is less critical and is chosen for considerations such as array size and network operating environment.

The fabrication of this integrated circuit is described with reference to the cross-sectional views of FIGS. 5, 6, and 7 wherein the starting material may be a P-type silicon body 60 having an N-type layer 61 epitaxially deposited thereupon. Using conventional diffusion techniques, for example, input transistors $T_X$, $T_{X'}$, etc.; clamp-high transistors $T_2$, $T_{2'}$, etc.; clamp-low transistors $T_1$, $T_{1'}$, etc., and resistors R, R′, etc., are formed within the N layer 61. P-type diffusions 65 are made so as to provide isolated pockets 41 and 42, for example, as shown in FIG. 5 so that the input and clamp-high transistors of one circuit stage are isolated from the input and clamp-high transistors of another stage and also isolated from the clamp-low transistors and load resistors. As observed from FIG. 5 the clamp-high transistors $T_2$, $T_{2'}$, etc. share a common collector region with the input transistors $T_X$, $T_{X'}$. An oxide layer 75 acquires a stepped configuration due to the diffusion process, and holes are cut through this oxide layer for appropriate contacts and interconnections. As illustrated in FIG. 6, the clamp-low transistors $T_1$, $T_{1'}$, etc. share a common collector region 61.

During the fabrication of the network, all diffusions are carried out simultaneously so that the respective bases and emitters of all transistors have corresponding impurity concentrations, junction depths, etc. The resistors R and R′ are formed during the base diffusion step of the transistors.

The resulting circuit is suitable for large scale integration on a single semiconductor slice due to its structural simplicity. Only one isolation pocket is required for every circuit stage, the entire network requires only one power supply, hence minimizing power buss connections, and since there are very few circuit components per circuit stage, it is possible to maximize the number of circuit stages per semiconductor slice.

The fact that all circuit components are formed simultaneously means that all components of the same class have "identical" operating characteristics. This insures that the operating characteristics of each circuit stage are identical to those of the other stages, which in turn insures reliable switching from one logic state to another between succeeding stages. In addition the identicalness of the stages avoids any stage from drawing too much current at the expense of another, and consequently allows for a high fanout of logic stages. In addition, any changes in temperatures which change the operating characteristic of one circuit component correspondingly changes the operating characteristics of the remaining components, thus insuring the continued reliable switching of each stage.

The particular circuit of this invention (the NOR logic circuit) may be interconnected with other like NOR logic circuits in various configurations to fabricate a logically complete digital network. As illustrated schematically in FIG. 8, all logic functions may therefore be performed, utilizing various combinations and subcombinations of the NOR gate circuits.

While the advantages of the present invention are optimized when all of the logic stages are fabricated upon a single semiconductor slice, connection may be effected between networks that are fabricated on different slices by providing conventional input and output buffer stages.

Although a preferred embodiment of the invention has been described in detail, it is to be understood that various changes, substitutions and alterations can be made therein. For example, many other logic circuit stages may be fabricated besides the particular NOR logic circuit described utilizing component and stage "tracking." In addition, although the circuit has been described with reference to NPN type devices, PNP devices are also applicable. Furthermore, the construction of the integrated circuit network is not limited to a silicon semiconductor slice but any semiconductor material may be used as for example, germanium, III–V compounds, II–VI compounds, etc. Moreover the logic network is not limited to a two-level logic system but is equally applicable to multi-level logic when desired. Various other modifications of the disclosed embodiment as well as other embodiments of the invention will occur to persons skilled in the art and so it is intended that the appended claims cover any such modifications or embodiments as found in the true scope of the invention.

What is claimed is:

1. An integrated logic network, comprising:

(a) a plurality of NOR logic circuits each comprising
   (1) at least one input transistor, a clamp-high transistor, a clamp-low transistor, and a resistor,
   (2) the emitter of said input transistor and the emitter of the said clamp-high transistor being commoned to ground,
   (3) the collector of said one input transistor, the collector of the said clamp-high transistor, and the emitter of the said clamp-low transistor being commoned to an output terminal,
   (4) the collector of the said clamp-low transistor being connected to a voltage supply, the base of said clamp-low transistor being connected to said collector of said clamp-low transistor,
   (5) the base of the clamp-high transistor being connected to the collector of said clamp-high transistor, the base of each of the said input transistor respectively connected to a corresponding input terminal, and
   (6) said resistor having one end connected to said collector of said clamp-low transistor and the other end connected to said output terminal; wherein (b) said NOR logic circuits are within a single semiconductor substrate; and wherein (c) said input transistors and said clamp-high transistors of each of said NOR logic circuits are within individual isolation pockets within said semiconductor substrate; and wherein (d) said clamp-low transistor and said resistor of each of said NOR logic circuits are within the remainder of said semiconductor substrate; and wherein (e) the output terminal of at least one of said NOR logic circuits is coupled to the input terminal of at least one other of said NOR logic circuits.

2. The integrated logic network of claim 1 wherein:

(a) said input transistors, said clamp-high transistors and said clamp-low transistors have simultaneously formed emitters, bases and collectors, respectively; and wherein (b) the emitter-base periphery of each of said input transistors is greater than the emitter-base periphery of said clamp-high transistors.

3. The integrated logic network of claim 1 wherein:

(a) when a low voltage is applied to all of said input terminals, a resultant current is produced in and limited by said resistor and said clamp-high transistor, so as to provide a high voltage at said output terminal; and wherein (b) when a high voltage is applied to any one of said input terminals, a resultant current is produced in and limited by said input transistor and said clamp-low transistor, so as to provide a low voltage at said output terminal.

References Cited

UNITED STATES PATENTS

| | | | |
|---|---|---|---|
| 3,325,653 | 6/1967 | Husher et al. | 307—213 |
| 3,378,695 | 4/1968 | Marette | 307—218 |

OTHER REFERENCES

Kellett, P. "The Elliott Sheffer Stroke Static Switching System," Electronic Engineering, September 1960, pp. 534–539.

DONALD D. FORRER, Primary Examiner

D. M. CARTER, Assistant Examiner

U.S. Cl. X.R.

307—213, 237